(12) United States Patent
Watanabe et al.

(10) Patent No.: US 11,199,785 B2
(45) Date of Patent: Dec. 14, 2021

(54) COATING AND DEVELOPING APPARATUS AND COATING AND DEVELOPING METHOD

(71) Applicant: Tokyo Electron Limited, Tokyo (JP)

(72) Inventors: Tsuyoshi Watanabe, Koshi (JP); Masashi Tsuchiyama, Koshi (JP); Hiroki Sato, Tokyo (JP); Ippei Hamada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/030,735

(22) Filed: Sep. 24, 2020

(65) Prior Publication Data

US 2021/0103224 A1    Apr. 8, 2021

(30) Foreign Application Priority Data

Oct. 2, 2019 (JP) .............................. JP2019-182092

(51) Int. Cl.
 *G03F 7/20* (2006.01)
 *H01L 21/67* (2006.01)
 *G03F 7/16* (2006.01)

(52) U.S. Cl.
 CPC .......... *G03F 7/70991* (2013.01); *G03F 7/162* (2013.01); *G03F 7/7075* (2013.01); *G03F 7/7085* (2013.01); *G03F 7/70733* (2013.01); *H01L 21/67178* (2013.01)

(58) Field of Classification Search
 CPC .. G03F 7/70733; G03F 7/7085; G03F 7/7075; G03F 7/708; G03F 7/70808; G03F 7/70841; G03F 7/70858; G03F 7/70975; G03F 7/70991; G03F 7/20; G03F 7/162; G03F 7/26; G03F 7/16; G03F 7/168; H01L 21/67178; H01L 21/67225;
(Continued)

(56) References Cited

U.S. PATENT DOCUMENTS 5,639,301 A * 6/1997 Sasada .............. H01L 21/67173
                                            118/52
2002/0009658 A1* 1/2002 Sato .................. H01L 21/67178
                                            430/30
(Continued)

FOREIGN PATENT DOCUMENTS

JP          2010-219434 A    9/2010

*Primary Examiner* — Christina A Riddle
(74) *Attorney, Agent, or Firm* — Posz Law Group, PLC

(57) ABSTRACT

An apparatus includes: a treatment block including treatment modules; and a relay block coupling the treatment block and an exposure apparatus in a width direction, and including a transfer-in/out mechanism for the exposure apparatus. In the treatment block being multilayered in an up-down direction, a transfer mechanism is provided in a transfer region extending in the width direction. In a layer, in the treatment block, at a position accessible from the transfer-in/out mechanism, a deliverer on which the substrate is mounted when the substrate is delivered between the blocks is provided at an end on the relay block side. Pre-exposure storages storing the substrate before the exposure are provided along the width direction in two regions between which the transfer region is interposed in a depth direction. A non-treatment unit is provided at a portion where the pre-exposure storages are not provided in the two regions.

20 Claims, 8 Drawing Sheets

(58) Field of Classification Search
CPC ......... H01L 21/67303; H01L 21/67742; H01L 21/67748; H01L 21/67173; H01L 21/67184; H01L 21/67745; H01L 21/67207; H01L 21/67703; H01L 21/6715; H01L 21/6719; H01L 21/67196; H01L 21/67051; H01L 21/67706; H01L 21/027; H01L 21/67769; H01L 22/12
USPC .... 355/18, 27, 30, 53, 72–77; 414/935–941; 118/500, 503, 712, 72; 430/30
See application file for complete search history.

(56) References Cited

U.S. PATENT DOCUMENTS

| | | | |
|---|---|---|---|
| 2007/0166031 A1* | 7/2007 | Hamada | H01L 21/67051 396/611 |
| 2008/0117390 A1* | 5/2008 | Kaneko | H01L 21/67276 355/27 |
| 2009/0165950 A1* | 7/2009 | Kim | H01L 21/67778 156/345.1 |
| 2010/0021621 A1* | 1/2010 | Hayashida | H01L 21/67276 427/8 |
| 2012/0181239 A1* | 7/2012 | Furusho | G03F 7/162 210/808 |
| 2013/0078061 A1* | 3/2013 | Enokida | H01L 21/67155 414/226.05 |
| 2013/0112224 A1* | 5/2013 | Nakaharada | H01L 22/20 134/18 |
| 2015/0096682 A1* | 4/2015 | Nakashima | G03F 7/162 156/345.11 |

* cited by examiner

COATING AND DEVELOPING APPARATUS AND COATING AND DEVELOPING METHOD

CROSS REFERENCE TO RELATED APPLICATIONS

This application is based upon and claims the benefit of priority of the prior Japanese Patent Application No. 2019-182092, filed in Japan on Oct. 2, 2019, the entire contents of which are incorporated herein by reference.

TECHNICAL FIELD

This disclosure relates to a coating and developing apparatus and a coating and developing method.

BACKGROUND

Japanese Laid-open Patent Publication No. 2010-219434 discloses a substrate treatment apparatus including a first treatment block and a second treatment block in which coating treatment units for forming a resist film on the substrate and so on are provided and an interface block which is arranged between the treatment blocks and an exposure apparatus for performing exposure processing by the immersion method. The interface block of the substrate treatment apparatus includes a block in which a transfer mechanism for performing the transfer in and the transfer out of the substrate to/from the exposure apparatus is provided, and a block in which a substrate mounting part and a mounting and cooling part for mounting the substrate before and after exposure processing are provided. The first treatment block, the second treatment block, the block in which the transfer mechanism is provided, and the block in which the mounting part and the mounting and cooling part are provided, are arranged in this order along one direction.

SUMMARY

An aspect of this disclosure is a coating and developing apparatus configured to form a resist film on a substrate, transfer the substrate to an exposure apparatus, and then perform a developing treatment on the substrate exposed in the exposure apparatus, the coating and developing apparatus including: a treatment block in which a treatment module configured to treat the substrate before the exposure or after the exposure is provided; and a relay block configured to couple the treatment block and the exposure apparatus in a width direction, wherein: in the relay block, a transfer-in/out mechanism configured to transfer the substrate into/out of the exposure apparatus is provided; and in the treatment block being multilayered in an up-down direction, a transfer mechanism configured to transfer the substrate is provided in a transfer region extending in the width direction, and in a layer, in the treatment block, at a height position accessible from the transfer-in/out mechanism in the relay block, a deliverer on which the substrate is mounted when the substrate is delivered between both the blocks is provided at an end on the relay block side, a plurality of pre-exposure storages each configured to store the substrate before the exposure are provided along the width direction in at least one of two regions between which the transfer region is interposed in a depth direction perpendicular to the width direction, and a non-treatment unit which causes no change of state in the substrate is provided at a portion where the pre-exposure storages are not provided in the two regions.

DETAILED DESCRIPTION

Figure 1:
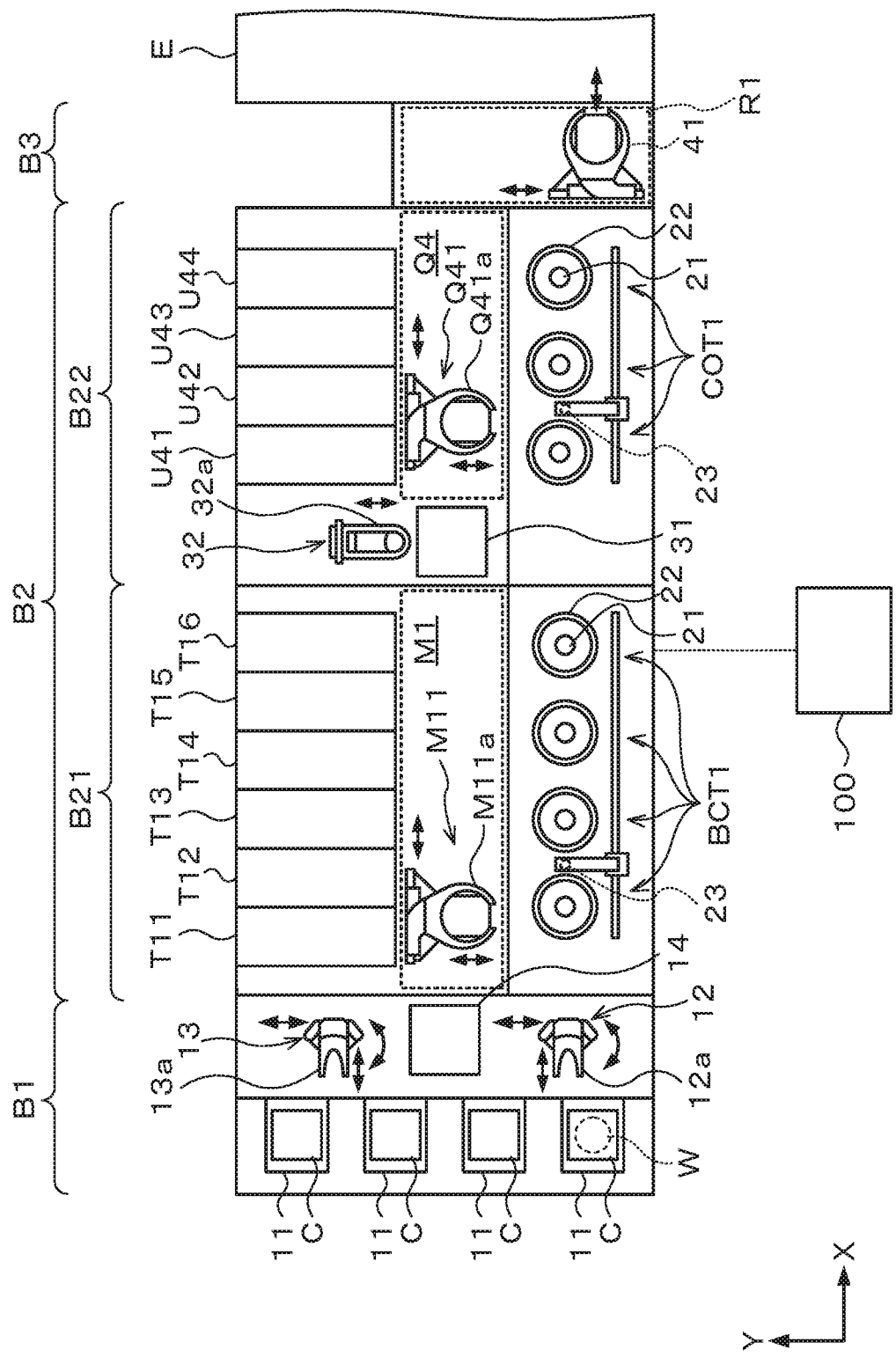
FIG. 1 is a plan view schematically illustrating the outline of a configuration of a coating and developing apparatus according to an embodiment.

In a photolithography process in a manufacturing process of a semiconductor device or the like, a series of treatments are performed to form a desired resist pattern on a semiconductor wafer (hereinafter, referred to as a "wafer"). The series of treatments include, for example, a resist film forming treatment of supplying a resist solution onto the wafer to form a resist film, exposure processing of exposing the resist film, and a developing treatment of supplying a developing solution to the exposed resist film to thereby develop the exposed resist film. Among these treatments and processing, the treatments except the exposure processing, such as the resist film forming treatment and the developing treatment are performed in a coating and developing apparatus. Further, the coating and developing apparatus has a treatment block in which treatment modules for performing the resist film forming treatment and so on are provided, and an interface block which connects the treatment block and an exposure apparatus. In the interface block, a transfer mechanism is provided which transfers the wafer into/out of the exposure apparatus. Japanese Laid-open Patent Publication No. 2010-219434 discloses an apparatus including the block in which a substrate transfer mechanism is provided and the block in which the substrate mounting part and the mounting and cooling part on which the substrate before and after exposure processing is mounted are provided. In the apparatus disclosed in Japanese Laid-open Patent Publication No. 2010-219434, the first treatment block and the second treatment block in which the coating treatment units and so on are provided, the block in which the substrate transfer mechanism is provided, and the block in which the substrate mounting part and the mounting and cooling part are provided, are arranged side by side in this order along one direction.

Incidentally, higher throughput of the resist pattern formation is required in recent years. To achieve the higher throughput, the number of installed treatment modules needs to be increased. Further, accompanying the increase, it is necessary to install a large number of modules on which wafers subjected to the treatments until the stage preceding to the exposure processing are mounted and which store the wafers until before exposure. However, in the case where the module on which the substrate before exposure is mounted is provided in the interface block as in the apparatus disclosed in Japanese Laid-open Patent Publication No. 2010-219434, if the number of installed modules is increased, the interface block becomes large in size, resulting in an increased size of the coating and developing apparatus. More specifically, the occupied floor area of the apparatus is increased. In particular, in the apparatus in Japanese Laid-open Patent Publication No. 2010-219434, the length in a direction in which the treatment block, the block in which the transfer mechanism is provided, and so on are arranged side by side becomes large, resulting in an increased occupied floor area.

Hence, the technique according to this disclosure provides a coating and developing apparatus capable of coping with treatments at high throughput and having a small occupied area.

Hereinafter, a coating and developing apparatus and a coating and developing method according to an embodiment will be explained referring to the drawings. Note that the same codes are given to components having substantially the same functional configurations in the description and the drawings to omit duplicated explanation.

Figure 2:
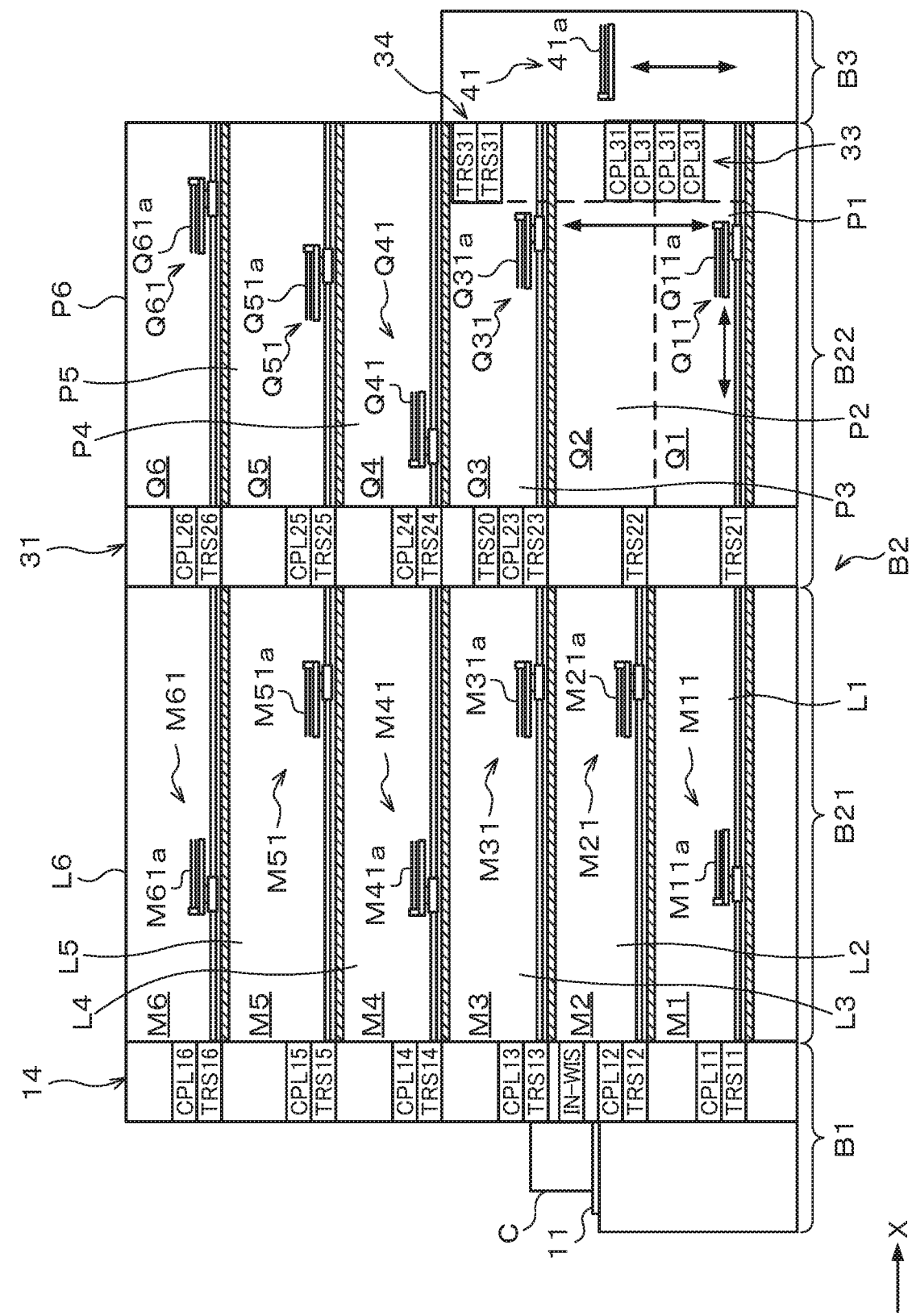
FIG. 2 is a longitudinal sectional front view schematically illustrating the outline of an internal configuration of the coating and developing apparatus according to the embodiment.
Figure 3:
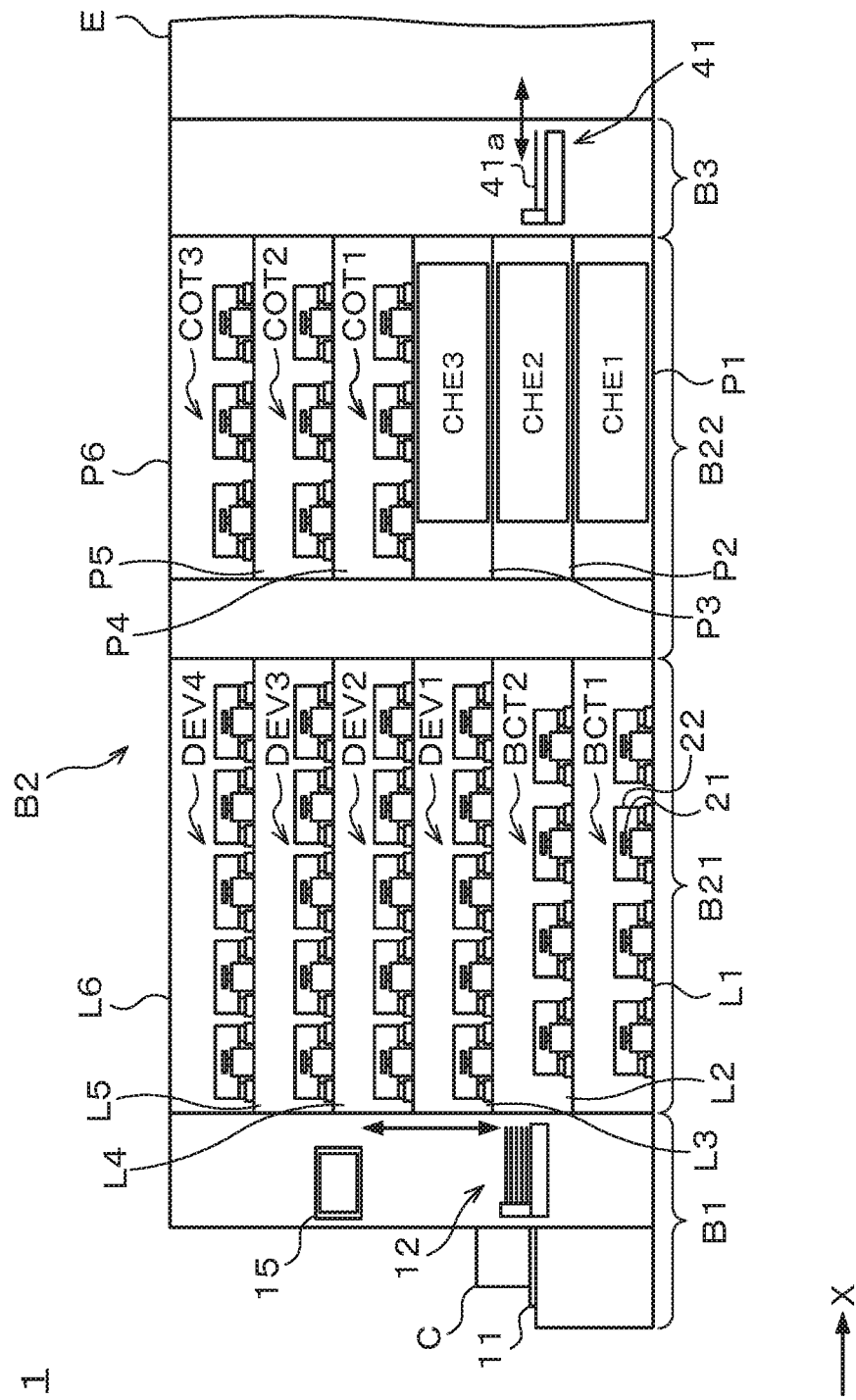
FIG. 3 is a front view schematically illustrating the outline of the configuration of the coating and developing apparatus according to the embodiment.
Figure 4:
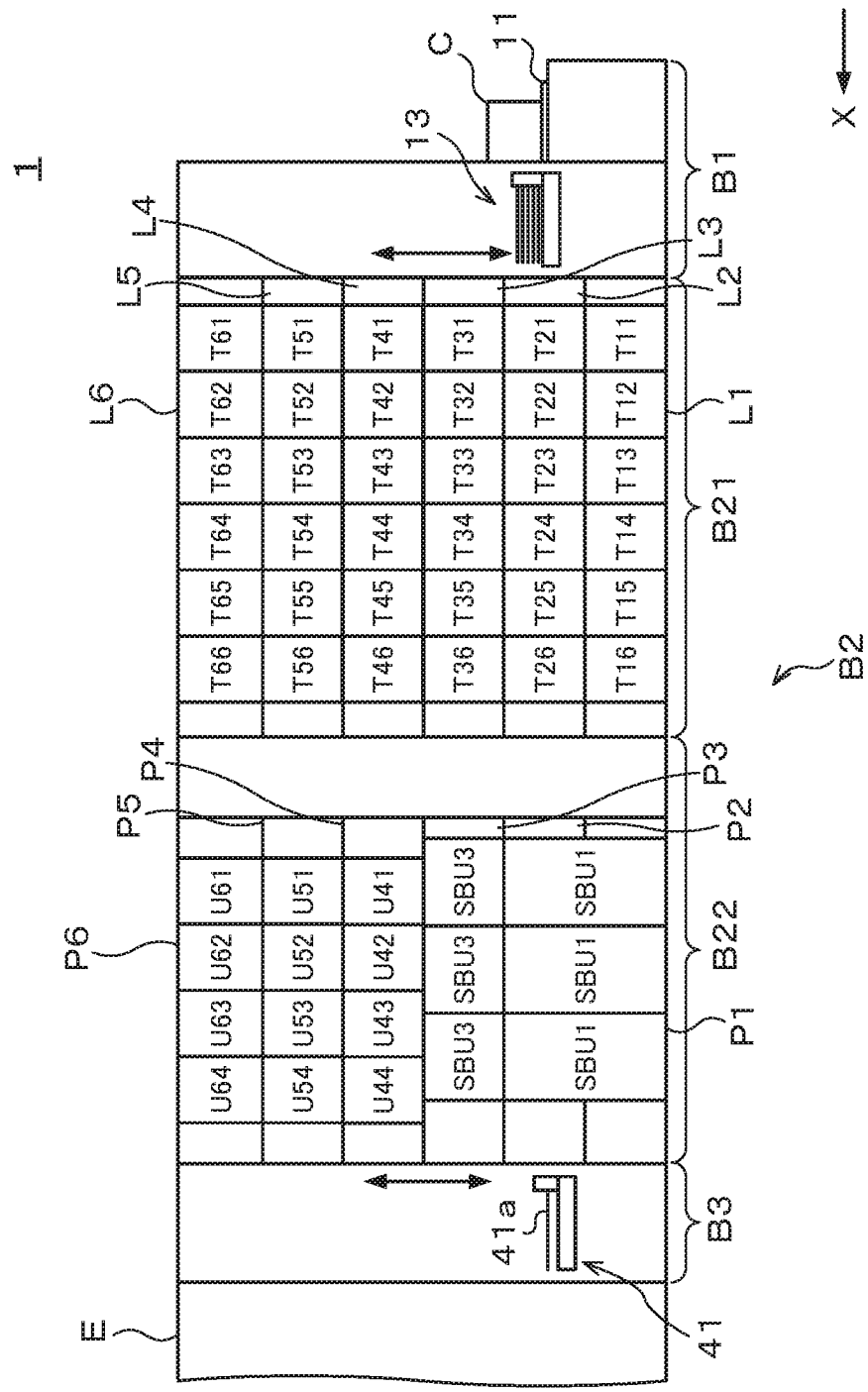
FIG. 4 is a rear view schematically illustrating the outline of the configuration of the coating and developing apparatus according to the embodiment.
Figure 5:
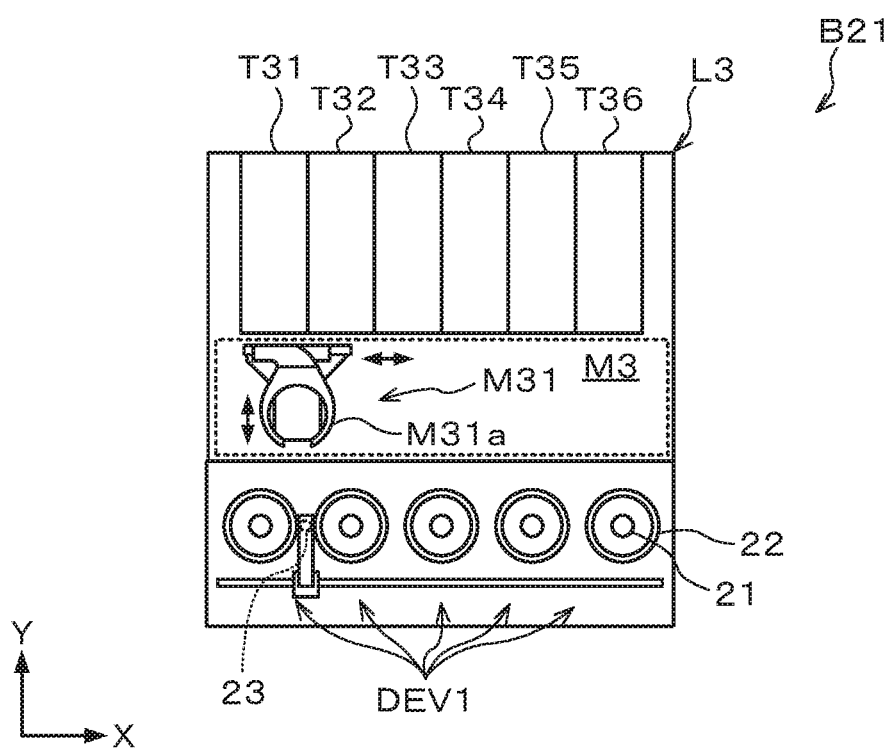
FIG. 5 is a plan view schematically illustrating the outline of an internal configuration of a third layer block included in a left sub-block of the coating and developing apparatus according to the embodiment.
Figure 6:
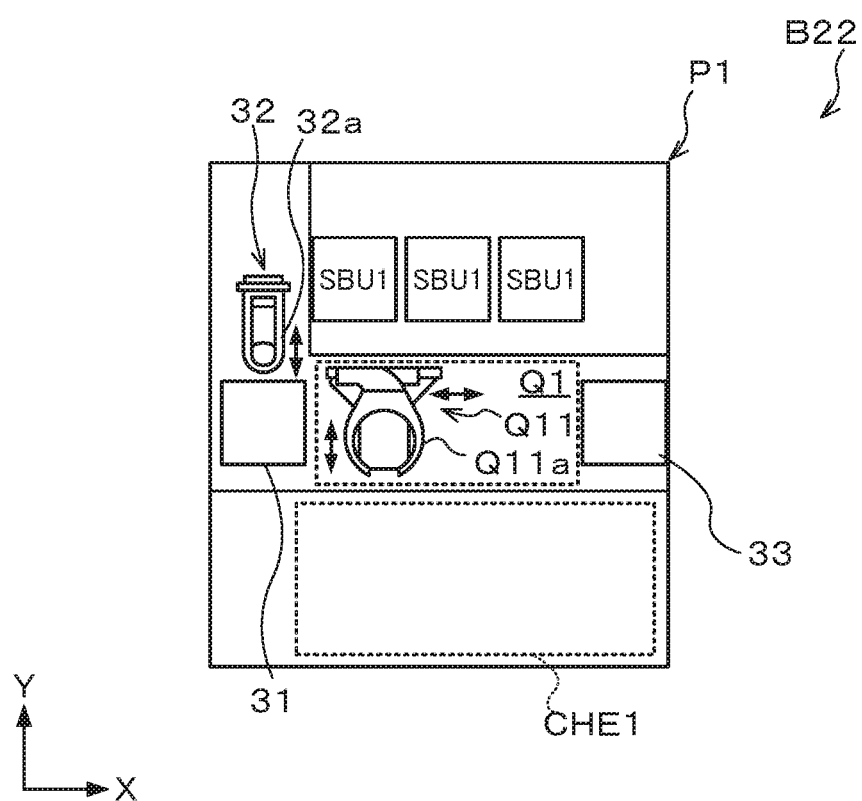
FIG. 6 is a plan view schematically illustrating the outline of an internal configuration of a first layer block included in a right sub-block of the coating and developing apparatus according to the embodiment.
Figure 7:
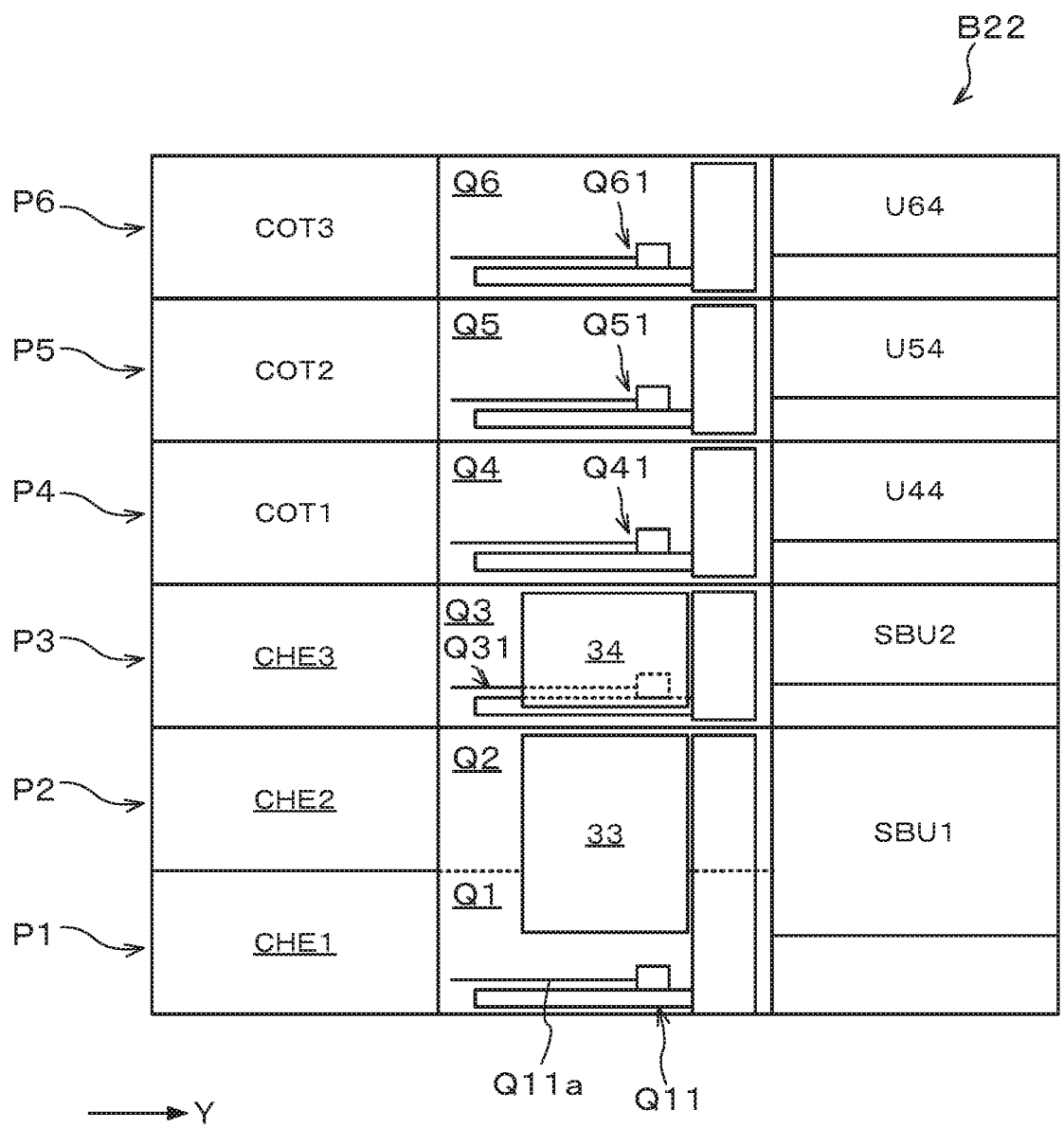
FIG. 7 is a right side view schematically illustrating the outline of a configuration of the right sub-block of the coating and developing apparatus according to the embodiment.
Figure 8:
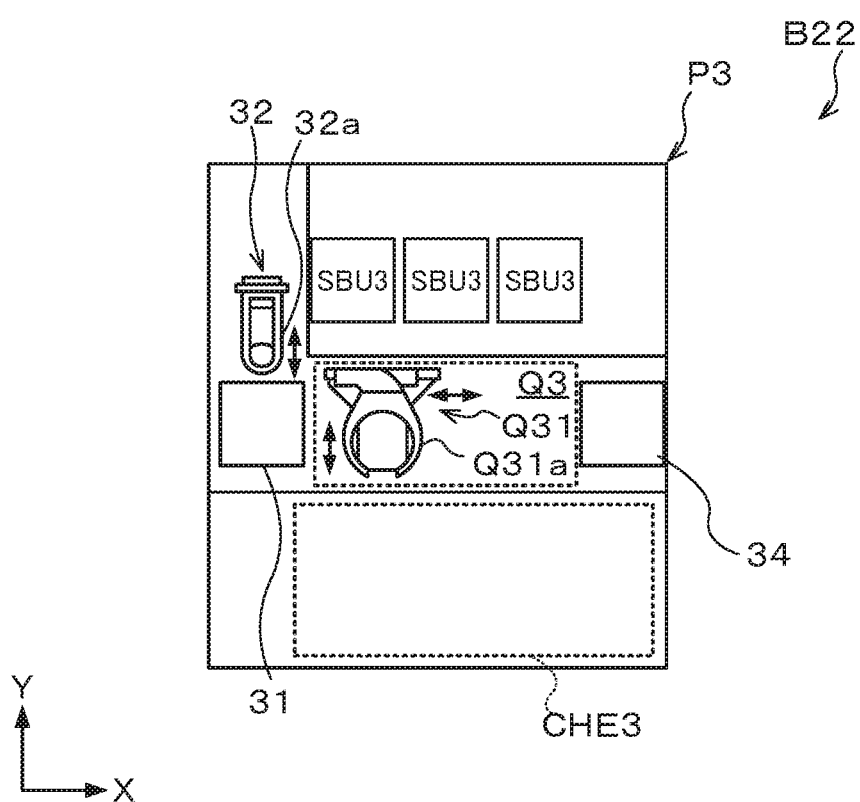
FIG. 8 is a plan view schematically illustrating the outline of an internal configuration of a third layer block included in the right sub-block of the coating and developing apparatus according to the embodiment.

FIG. 1 is a plan view schematically illustrating the outline of a configuration of a coating and developing apparatus 1. FIG. 2 is a longitudinal sectional front view schematically illustrating the outline of an internal configuration of the coating and developing apparatus 1. FIG. 3 and FIG. 4 are a front view and a rear view schematically illustrating the outline of the configuration of the coating and developing apparatus 1, respectively. FIG. 5 is a plan view schematically illustrating the outline of an internal configuration of a third layer block included in a later-explained left sub-block of the coating and developing apparatus 1. FIG. 6 is a plan view schematically illustrating the outline of an internal configuration of a first layer block included in a later-explained right sub-block of the coating and developing apparatus 1. FIG. 7 is a right side view schematically illustrating the outline of a configuration of the right sub-block. FIG. 8 is a plan view schematically illustrating the outline of an internal configuration of a third layer block of the right sub-block.

In the coating and developing apparatus 1, as illustrated in FIG. 1, a carrier block B1, a treatment block B2, and an interface block B3 as a relay block are provided to be arranged side by side in this order along a width direction (X-direction in the drawing). In the following explanation, the aforementioned width direction may be explained as a right-left direction. To the right side (X-direction positive side in the drawing) of the interface block B3, an exposure apparatus E is connected.

The carrier block B1 is a block into/out of which a carrier C for collectively transferring a plurality of wafers W as substrates is transferred.

In the carrier block B1, for example, a mounting plate 11 is provided on which the carrier C is mounted when the carrier C is transferred in/out from/to the outside of the coating and developing apparatus 1. A plurality of (four in the example of the drawing) mounting plates 11 are provided along a depth direction (Y-direction in the drawing) perpendicular, within a horizontal plane, to the width direction (X-direction in the drawing). Further, in a region on the right side (X-direction positive side in the drawing) of a region where the mounting plates 11 are provided in the carrier block B1, a wafer transfer mechanism 12 is provided on the near side (Y-direction negative side in the drawing), and a wafer transfer mechanism 13 is provided on the deep side (Y-direction positive side in the drawing). Further, a delivery tower 14 is provided between the wafer transfer mechanism 12 and the wafer transfer mechanism 13 in the depth direction.

The wafer transfer mechanism 12 has a transfer arm 12a configured to freely move back and forth, freely move up and down, freely rotate around a vertical axis, and freely move in the depth direction (Y-direction in the drawing). This makes it possible to transfer the wafers W between the carriers C on the two mounting plates 11 on the near side (Y-direction negative side in the drawing) and a later-explained inspection module IN-WIS in the delivery tower 14 and between the inspection module IN-WIS and later-explained delivery modules in the delivery tower 14.

The wafer transfer mechanism 13 has a transfer arm 13a configured to freely move back and forth, freely move up and down, freely rotate around a vertical axis, and freely move in the depth direction (Y-direction in the drawing). This makes it possible to transfer the wafers W between the carriers C on the two mounting plates 11 on the deep side (Y-direction positive side in the drawing) and the inspection module IN-WIS in the delivery tower 14 and between the inspection module IN-WIS and the delivery modules in the delivery tower 14.

In the delivery tower 14, as illustrated in FIG. 2, a plurality of delivery modules are layered in an up-down direction. In the delivery tower 14, the delivery modules are provided at height positions corresponding to respective layer blocks of first to sixth layer blocks L1 to L6 included in a later-explained left sub-block B21 of the treatment block B2. More specifically, in the delivery tower 14, delivery modules TRS11, CPL11 are provided at positions corresponding to the first layer block L1 in the treatment block B2. Similarly, delivery modules TRS12 to TRS16, CPL12 to CPL16 are provided at positions corresponding to the second to sixth layer blocks L2 to L6. Note that the delivery module given "TRS" and the delivery module given "CPL" are almost similarly configured, and are different from each other in that the stage on which the wafer W is to be mounted of only the latter module is formed with a medium flow path for regulating the temperature of the wafer W.

Further, in the delivery tower 14, the inspection module IN-WIS is provided at the height position accessible from the wafer transfer mechanisms 12, 13, more specifically, the position between the delivery module CPL12 and the delivery module TRS13. In other words, the inspection module IN-WIS is provided in the vicinity of the block closer to the height of the carrier C on the mounting plate 11, that is, the first layer block L1 or second layer block L2 into which the wafer W may be transferred first in the treatment block B2. The inspection module IN-WIS is a module which inspects the wafer W before coating and developing treatments and has an imaging unit for imaging the front surface of the wafer W and the like.

Note that a space below the mounting plates 11 in the treatment block B1 is used, for example, as a chemical chamber which accommodates treatment solution bottles for storing various treatment solutions and pumps for pressure-feeding the various treatment solutions, and so on.

The treatment block B2 is a block in which the treatment modules for treating the wafer W before exposure or after exposure, and is composed of a plurality of (two in the example of the drawing) sub-blocks B21, B22 connected in the right-left direction (X-direction in the drawing) in this embodiment. Hereinafter, the sub-block B21 on the carrier block B1 side is called a left sub-block B21, and the sub-block B22 on the interface block B3 side is called a right sub-block B22.

The left sub-block B21 and the right sub-block B22 are each multilayered in the up-down direction and include first to sixth layer blocks L1 to L6 and first to sixth layer blocks P1 to P6, respectively, as illustrated in FIG. 3 and FIG. 4. In each layer block, various treatment modules are provided. Note that, in FIG. 1, the configuration of the first layer block L1 is illustrated for the left sub-block B21, and the first layer block L1 will be concretely explained first in the following.

As illustrated in FIG. 1, a transfer region M1 extending in the width direction (X-direction in the drawing) is formed at the middle in the depth direction (Y-direction in the drawing) of the first layer block L1 in the left sub-block B21.

A plurality of various modules are provided along the width direction in each of a region on one side (near side, Y-direction negative side in the drawing) and a region on the other side (deep side, Y-direction positive side in the drawing) in the depth direction with the transfer region M1 interposed therebetween in the first layer block L1.

More specifically, four anti-reflection film forming modules BCT1 are provided along the width direction (X-direction in the drawing) in the region on the near side in the first layer block L1, and vertical units T11 to T16 having various modules are provided in the region on the deep side.

Each of the anti-reflection film forming modules BCT1 forms an anti-reflection film on the wafer W. The anti-reflection film forming module BCT1 has a spin chuck 21 which holds and rotates the wafer W, and a cup 22 which surrounds the wafer W on the spin chuck 21 and collects a treatment solution scattering from the wafer W. Further, a nozzle 23 is provided which discharges a treatment solution for forming the anti-reflection film on the wafer held on the spin chuck 21. The nozzle 23 is configured to be movable among the anti-reflection film forming modules BCT1 and is shared among the anti-reflection film forming modules BCT1.

The vertical units T11 to T16 are provided in this order from the left side (X-direction negative side in the drawing) along the width direction. The vertical unit T11 on the leftmost side, that is, on the carrier block B1 side has an inspection module (inspection module WIS-B) which inspects the wafer W after the formation of the anti-reflection film, and the module has an imaging unit which images the front surface of the wafer W and so on. Each of the vertical units T12, T13 has hydrophobic treatment modules each of which performs a hydrophobic treatment on the wafer W, and the hydrophobic treatment modules are layered, for example, at two upper and lower stages in each of the units. Each of the vertical units T14 to T16 has heating modules each of which performs a heat treatment on the wafer W, and the heating modules are layered, for example, at two upper and lower stages in each of the units.

Further, in the first layer block L1, a wafer transfer mechanism M11 is provided in the transfer region M1. The wafer transfer mechanism M11 has a transfer arm M11a configured to freely move back and forth, freely move up and down, freely rotate around a vertical axis, and freely move in the width direction (X-direction in the drawing), and can deliver the wafer W among the modules in the first layer block L1. The transfer arm M11a can get access also to a later-explained delivery tower 31 in the right sub-block B22.

The second layer block L2 is configured similarly to the first layer block L1. Note that a transfer region provided in the second layer block L2 is denoted by M2, anti-reflection film forming modules are denoted by BCT2, and vertical units are denoted by T21 to T26 in the drawing and the like. Further, a wafer transfer mechanism provided in the transfer region M2 is denoted by M21, and a transfer arm of the wafer transfer mechanism M21 is denoted by M21a.

In the third layer block L3 in the left sub-block B21, as illustrated in FIG. 5, a transfer region M3 extending in the width direction (X-direction in the drawing) is formed at the middle in the depth direction (Y-direction in the drawing).

Five developing modules DEV1 are provided along the width direction in a region on the near side (Y-direction negative side in the drawing) of the transfer region M3 in the third layer block L3, and vertical units T31 to T36 having various modules are provided in a region on the deep side (Y-direction positive side in the drawing) of the transfer region M3.

Each of the developing modules DEV1 performs a developing treatment on the wafer W after exposure. The developing module DEV1 also has a spin chuck 21 and a cup 22 similarly to the anti-reflection film forming module BCT1. Further, a nozzle 23 is provided which is shared among the developing modules DEV1. Note that from the nozzle 23 for the developing modules DEV1, a developing solution is discharged.

The vertical units T31 to T36 are provided in this order from the left side (X-direction negative side in the drawing) along the width direction. The vertical unit T31 on the leftmost side, that is, on the carrier block B1 side has a module (inspection module OUT-WIS) which inspects the wafer W after development, and the module has an imaging unit which images the front surface of the wafer W and so on. Each of the vertical units T32 to T36 has heating modules each of which performs a heat treatment on the wafer W, and the heating modules are layered, for example, at two upper and lower stages in each of the units.

Further, in the third layer block L3, a wafer transfer mechanism M31 is provided in the transfer region M3. The wafer transfer mechanism M31 has a transfer arm M31a configured to freely move back and forth, freely move up and down, freely rotate around a vertical axis, and freely move in the width direction (X-direction in the drawing), and can deliver the wafer W among the modules in the third layer block L3. The transfer arm M31a can get access also to the later-explained delivery tower 31 in the right sub-block B22.

The fourth to sixth layer blocks L4 to L6 are configured similarly to the third layer block L3. Note that transfer regions provided in the fourth to sixth layer blocks L4 to L6 are denoted by M4 to M6, developing modules are denoted by DEV2 to DEV4, and vertical units are denoted by T41 to T46, T51 to T56, T61 to T66 in the drawing and the like. Further, wafer transfer mechanisms provided in the transfer regions M4 to M6 are denoted by M41, M51, M61, and transfer arms of the wafer transfer mechanisms M41, M51, M61 are denoted by M41a, M51a, M61a, respectively.

Note that the fact that all of the third to sixth layer blocks are similarly configured means that a plurality of inspection modules OUT-WIS are provided so as to respectively correspond to the wafer transfer mechanisms M31, M41, M51, M61 which deliver the wafers W to/from the developing modules DEV1.

The right sub-block B22 has, as illustrated in FIG. 2, the delivery tower 31 at a position adjacent, in the width direction (X-direction in the drawing), to the transfer regions M1 to M6 in the left sub-block B21. The delivery tower 31 is provided to extend across the first to sixth layer blocks P1 to P6 in the right sub-block B22.

In the delivery tower 31, a plurality of delivery modules are layered in the up-down direction. In the delivery tower 31, the delivery modules are provided at height positions corresponding to respective layer blocks such as the first to sixth layer blocks L1 to L6 and the first to sixth layer blocks P1 to P6. More specifically, in the delivery tower 31, a delivery module TRS21 is provided at a position corresponding to the first layer block L1 and the first layer block P1. Similarly, a delivery module TRS22 is provided at a position corresponding to the second layer block L2 and the second layer block P2. Further, delivery modules TRS23 to TRS26 and CPL23 to CPL26 are provided at positions corresponding to the third to sixth layer blocks L3 to L6 and the third to sixth layer blocks P3 to P6.

Further, in the delivery tower 31, a delivery module TRS20 is provided at a height position accessible from a later-explained wafer transfer mechanism Q31. The delivery module TRS20 is used, for example, in transferring the wafer W from the right sub-block B22 into the left sub-block B21. Note that the delivery module TRS20 is almost at the same height position as a later-explained post-exposure delivery box 34.

Further, in the right sub-block B22, as illustrated in FIG. 1, a wafer transfer mechanism 32 is provided on the deep side (Y-direction positive side in the drawing) of the delivery tower 31. The wafer transfer mechanism 32 has a transfer arm 32a which is configured to freely move back and forth and freely move up and down, and thus can transfer the wafer W among the delivery modules in the delivery tower 31.

Next, the first to sixth layer blocks P1 to P6 in the right sub-block B22 will be explained.

Of the first to sixth layer blocks P1 to P6, the first to third layer blocks P1 to P3 are accessible layers and the fourth to sixth layer blocks P4 to P6 are inaccessible layers. The accessible layer is a layer at a height position accessible from a later-explained wafer transfer mechanism 41 in the interface block B3, and the inaccessible layer is a layer at a height position inaccessible from the wafer transfer mechanism 41. Further, wafer transfer mechanisms are provided in the fourth to sixth layer blocks P4 to P6 being the inaccessible layers, and wafer transfer mechanisms are provided also in the first to third layer blocks P1 to P3 being the accessible layers. The wafer transfer mechanisms in the fourth to sixth layer blocks P4 to P6 and the wafer transfer mechanisms in the first to third layer blocks P1 to P3 are independent from each other and operated independently from each other.

In this embodiment, treatment modules such as solution treatment modules and thermal treatment modules are provided in the fourth to sixth layer blocks P4 to P6 being the inaccessible layers, but no treatment modules are provided in the first to third layer blocks P1 to P3. This will be explained concretely in the following. Note that, in FIG. 1, the configuration of the fourth layer block P4 being the inaccessible layer of the first to sixth layer blocks P1 to P6 is illustrated for the right sub-block B22. The fourth layer block P4 will be explained first in the following.

As illustrated in FIG. 1, in the fourth layer block P4, a transfer region Q4 extending in the width direction (X-direction in the drawing) from the delivery tower 31 is formed at the middle in the depth direction (Y-direction in the drawing).

Three resist film forming modules COT1 are provided along the width direction in a region on the near side (Y-direction negative side in the drawing) of the transfer region Q4 in the fourth layer block P4, and vertical units U41 to U44 having various modules are provided in a region on the deep side (Y-direction positive side in the drawing) of the transfer region Q4.

Each of the resist film forming modules COT1 forms a resist film on the wafer W on which the anti-reflection film has been formed. The resist film forming module COT1 also has a spin chuck 21 and a cup 22 similarly to the anti-reflection film forming module BCT1. Further, a nozzle 23 is provided which is shared among the resist film forming modules COT1. Note that from the nozzle 23 for the resist film forming modules COT1, a resist solution for forming the resist film is discharged.

The vertical units U41 to U44 are provided in this order from the left side (X-direction negative side in the drawing) along the width direction. Each of the vertical units U41 to U43 has heating modules each of which performs a heat treatment on the wafer W, and the heating modules are layered, for example, at two upper and lower stages in each of the units. The vertical unit U44 has a module (inspection module WES) which inspects the wafer W after the formation of a resist film and performs edge exposure on the wafer W, and the module has an imaging unit which images the front surface of the wafer W, a light source for edge exposure and so on.

Further, in the fourth layer block P4, a wafer transfer mechanism Q41 is provided in the transfer region Q4. The wafer transfer mechanism Q41 has a transfer arm Q41a configured to freely move back and forth, freely move up and down, freely rotate around a vertical axis, and freely move in the width direction (X-direction in the drawing), and can deliver the wafer W among the modules in the fourth layer block P4. The transfer arm Q41a can get access also to the delivery tower 31.

The fifth and sixth layer blocks P5, P6 are configured similarly to the fourth layer block P4. Note that transfer regions provided in the fifth and sixth layer blocks P5, P6 are denoted by Q5, Q6, resist film forming modules are denoted by COT2, COT3, and vertical units are denoted by U51 to U54, U61 to U64 in the drawing and the like. Further, wafer transfer mechanisms provided in the transfer regions Q5, Q6 are denoted by Q51, Q61, and transfer arms of the wafer transfer mechanisms Q51, Q61 are denoted by Q51a, Q61a.

Next, the first to third layer blocks P1 to P3 being the accessible layers will be explained.

In the first layer block P1, as illustrated in FIG. 6, a transfer region Q1 extending in the width direction (X-direction in the drawing) from the delivery tower 31 is formed at the middle in the depth direction (Y-direction in the drawing).

A region on the near side (Y-direction negative side in the drawing) of the transfer region Q1 in the first layer block P1 is used as a chemical chamber which accommodates a unit for various treatment solutions such as a resist solution, namely, a treatment solution unit CHE1. The treatment solution unit CHE1 is an example of a non-treatment unit which causes no change of state in the wafer W, and has, for example, at least one of a treatment solution bottle for storing various treatment solutions used in the treatment in a treatment module in another block and a pump for pressure-feeding the various treatment solutions. The CHE1 is not one in which the wafer W is carried in like BCT1 and COT1.

In a region on the deep side (Y-direction positive side in the drawing) of the transfer region Q1 in the first layer block P1, a plurality of (three in the example of the drawing) pre-exposure storing modules SBU1 as pre-exposure storages each of which stores the wafers W before exposure are provided along the width direction (X-direction in the drawing). The pre-exposure storing module SBU1 is configured as a buffer which can store and retain a plurality of wafers W. Further, the pre-exposure storing module SBU1 is provided to extend across the first layer block P1 and the second layer block P2 as illustrated in FIG. 7. In the pre-exposure storing module SBU1, the wafer W which has been subjected to the treatments until before exposure can be retained at the normal time and at the abnormal time when a failure or the like of the exposure apparatus E occurs.

The transfer region Q1 in the first layer block P1 is smaller in length in the width direction, namely, in width than the transfer regions Q4 to Q6 as illustrated in FIG. 2. Further, in the transfer region Q1, a wafer transfer mechanism Q11 which is shared with a later-explained transfer region Q2 in the second layer block P2 is provided. The wafer transfer mechanism Q11 has a transfer arm Q11a configured to freely move back and forth, freely move up and down, freely rotate around a vertical axis, and freely move in a width direction (X-direction in the drawing).

Further, in the first layer block P1, a pre-exposure delivery box 33 as a pre-exposure deliverer is provided at the end on the interface block B3 side (X-direction positive side in the drawing). Concretely, the pre-exposure delivery box 33 is provided in a region adjacent to the interface block B3 side (X-direction positive side in the drawing) in the transfer region Q1 in the first layer block P1. The delivery box 33 is provided by layering delivery modules CPL31. In other words, the delivery box 33 is configured to be able to store a plurality of wafers W in layers. Further, the delivery box 33 is provided to extend across the first layer block P1 and the second layer block P2.

In the second layer block P2, as illustrated in FIG. 2 and FIG. 7, a transfer region Q2 extending in the width direction (X-direction in the drawing) from the delivery tower 31 is formed at the middle in the depth direction (Y-direction in the drawing) as in the first layer block P1.

A region on the near side (Y-direction negative side in the drawing) of the transfer region Q2 in the second layer block P2 is used as a chemical chamber which accommodates a treatment solution unit CHE2 as in the first layer block P1.

Further, in a region on the deep side (Y-direction positive side in the drawing) of the transfer region Q2 in the second layer block P2, the aforementioned pre-exposure storing modules SBU1 extending across the first layer block P1 and the second layer block P2 exist to be arranged side by side along the width direction (X-direction in the drawing).

The transfer region Q2 in the second layer block P2 is smaller in width, similarly to the transfer region Q1, than the transfer regions Q4 to Q6. Further, in a region, adjacent to the interface block B3 side, of the transfer region Q2, the aforementioned pre-exposure delivery box 33 extending across the first layer block P1 and the second layer block P2 is provided. Further, the aforementioned wafer transfer mechanism Q11 shared with the transfer region Q1 is provided in the transfer region Q2.

The wafer transfer mechanism Q11 can transfer the wafer W using the aforementioned transfer arm Q11a, between the delivery tower 31 and the pre-exposure storing module SBU1 and between the pre-exposure storing module SBU1 and the pre-exposure delivery box 33.

In the third layer block P3, as illustrated in FIG. 8, a transfer region Q3 extending in the width direction (X-direction in the drawing) from the delivery tower 31 is formed at the middle in the depth direction (Y-direction in the drawing) as in the first layer block P1.

A region on the near side (Y-direction negative side in the drawing) of the transfer region Q3 in the third layer block P3 is used as a chemical chamber which accommodates a treatment solution unit CHE3 as in the first layer block P1.

Further, in a region on the deep side (Y-direction positive side in the drawing) of the transfer region Q3 in the third layer block P3, a plurality of (three in the example of the drawing) post-exposure storing modules SBU3 as post-exposure storages each of which stores the wafers W after exposure are provided along the width direction (X-direction in the drawing). Note that the number of the post-exposure storing modules SBU3 is plural but may be single. The post-exposure storing module SBU3 is configured to be able to store and retain a plurality of wafers W.

The transfer region Q3 in the third layer block P3 is smaller in width, similarly to the transfer region Q1, than the transfer regions Q4 to Q6 as illustrated in FIG. 2. Further, in the transfer region Q3, a wafer transfer mechanism Q31 is provided. The transfer mechanism Q31 has a transfer arm Q31a configured to freely move back and forth, freely move up and down, freely rotate around a vertical axis, and freely move in the width direction (X-direction in the drawing). This makes it possible to transfer the wafer W between the later-explained post-exposure delivery box 34 and the post-exposure storing module SBU3, between the post-exposure storing module SBU3 and the delivery tower 31, and between the post-exposure delivery box 34 and the delivery tower 31.

Further, in the third layer block P3, the post-exposure delivery box 34 as a post-exposure deliverer is provided at the end on the interface block B3 side (X-direction positive side in the drawing). Concretely, the post-exposure delivery box 34 is provided in a region, adjacent to the interface block B3 side (X-direction positive side in the drawing), of the transfer region Q3 in the third layer block P3. Further, in the post-exposure delivery box 34, a plurality of delivery modules TRS31 are layered. The number of the delivery modules TRS31 provided in the post-exposure delivery box 34 is plural in the example of the drawing but may be single.

In the interface block B3, as illustrated in FIG. 1, the wafer transfer mechanism 41 as a transfer-in/out mechanism which transfers the wafer W into/out of the exposure apparatus E is provided in a relay side transfer region R1. The relay side transfer region R1 extends, in plan view, along the depth direction from the middle in the depth direction (Y-direction in the drawing) up to the end on the near side. Note that there are various types of exposure apparatuses E, and therefore the relay side transfer region R1 needs to be made large, to some extent, in length in the depth direction in order to be made applicable to the various types of exposure apparatuses E.

The wafer transfer mechanism 41 has a transfer arm 41a configured to freely move back and forth, freely rotate around a vertical axis, and freely move in a depth direction (Y-direction in the drawing). The transfer arm 41a is also configured to freely move up and down, more specifically, configured to freely move up and down so as to be able to get access to the first to third layer blocks P1 to P3 in the right sub-block B22 of the treatment block B2. The wafer transfer mechanism 41 can transfer the wafer W using the transfer arm 41a between the pre-exposure delivery box 33 and the exposure apparatus E and between the exposure apparatus E and the post-exposure delivery box 34.

Note that in the interface block B3, no module other than the wafer transfer mechanism 41 is provided.

The coating and developing apparatus 1 configured as above has a controller 100. The controller 100 is a computer including, for example, a CPU, a memory, and so on, and has a program storage (not illustrated). In the program storage, programs for controlling the operations of drive systems of the various treatment modules, the wafer transfer mechanisms and so on to perform various treatments on the wafer W are stored. Note that the programs may be the ones which are recorded on a computer-readable storage medium and installed from the storage medium into the controller 100. Some or all of the programs may be realized by dedicated hardware (circuit board).

Note that the near side in the depth direction (Y-direction in the drawing) of the coating and developing apparatus 1 is a side on which an operator performs operations more easily than on the deep side, and is provided with an operation panel 15 for operating the coating and developing apparatus 1 as illustrated in FIG. 3. In the coating and developing apparatus 1, the treatment solution units CHE1 to 3 are provided as explained above on the near side that is the side on which the operations are easy to perform.

Next, the coating and developing treatments performed using the coating and developing apparatus 1 configured as above will be explained.

First, the carrier C housing a plurality of wafers W is transferred into the carrier block B1 of the coating and developing apparatus 1. Thereafter, the wafers W in the carrier C are transferred in sequence by the wafer transfer mechanism 12 or the wafer transfer mechanism 13 into the inspection module IN-WIS in the delivery tower 14, and the inspection of the wafer W before the coating and developing treatments is performed using the inspection module IN-WIS.

Subsequently, the wafer W is transferred by the wafer transfer mechanism 12 or the wafer transfer mechanism 13 to, for example, the delivery module TRS11 in the delivery tower 14.

The wafer W is next transferred by the wafer transfer mechanism M11 into the first layer block L1 in the left sub-block B21 of the treatment block B2, and transferred, for example, to the vertical unit T12 (hydrophobic treatment module) and subjected to a hydrophobic treatment. The wafer W is thereafter transferred by the wafer transfer mechanism M11, for example, in the order of the delivery module CPL11→the anti-reflection film forming module BCT1→the vertical unit T13 (thermal treatment module) →the vertical unit T11 (inspection module WIS-B). Thus, an anti-reflection film is formed on the wafer W, and the inspection of the wafer W using the inspection module WIS-B is performed.

Subsequently, the wafer W is transferred by the wafer transfer mechanism M11 to the delivery module TRS21 in the delivery tower 31, and transferred into the right sub-block B22 of the treatment block B2. The wafer W is thereafter transferred by the wafer transfer mechanism 32 to, for example, the delivery modules CPL24 and transferred into the fourth layer block P4. The wafer W is thereafter transferred by the wafer transfer mechanism Q41 in the order of the resist film forming module COT1→the vertical unit U41 (thermal treatment module)→the vertical unit U44 (inspection module WES)→the delivery module TRS24. Thus, a resist film is formed on the anti-reflection film on the wafer W, and the inspection of the wafer W and the edge exposure on the wafer W using the inspection module WES are performed.

Subsequently, the wafer W is transferred by the wafer transfer mechanism 32 to, for example, the delivery module TRS21 and transferred into the first layer block P1. The wafer W is thereafter transferred by the wafer transfer mechanism Q11 to the pre-exposure storing module SBU1.

By repeating the above processes, the wafers W are sequentially accumulated in the pre-exposure storing modules SBU1.

The wafers W accumulated in the pre-exposure storing modules SBU1 are each transferred by the wafer transfer mechanism Q11 out of the pre-exposure storing module SBU1 at predetermined timing and transferred to the delivery module CPL31 in the pre-exposure delivery box 33.

The wafer W is thereafter transferred by the wafer transfer mechanism 41 to the exposure apparatus E and exposed. In the exposure apparatus E, dry exposure processing using, for example, KrF excimer laser or ArF excimer laser is performed.

After the exposure, the wafer W is transferred by the wafer transfer mechanism 41 to the post-exposure delivery box 34 and transferred again into the treatment block B2.

As in the above manner, the layer blocks (first to third layer blocks P1 to P3) in which the units essential for the treatments are not provided are used as a path of the wafer W to the interface block B3.

Subsequently, the wafer W is transferred by the wafer transfer mechanism Q31 to the delivery module TRS20 in the delivery tower 31. Here, the wafer W is transferred from the post-exposure delivery box 34 directly to the delivery module TRS20. However, when the setting temperature of a hot plate in the thermal treatment module which performs a later-explained PEB treatment or the like is changed, the wafer W may be stored once in the post-exposure storing module SBU3 and then transferred to the delivery module TRS20 in the delivery tower 31. In this case, for example, after the completion of the change of the setting temperature of the hot plate, the wafer W is transferred by the wafer transfer mechanism Q31 from the post-exposure storing module SBU3 to the delivery module TRS20.

After the transfer to the delivery module TRS20, the wafer W is transferred by the wafer transfer mechanism 32 to, for example, the delivery module TRS24 in the delivery tower 31. Subsequently, the wafer W is transferred by the wafer transfer mechanism M41 into the fourth layer block L4 in the left sub-block B21, transferred to, for example, the vertical unit T42 (thermal treatment module), and subjected to the PEB treatment. The wafer W is thereafter transferred by the wafer transfer mechanism M41 in the order of the delivery module CPL24→the developing module DEV1→the vertical unit T33 (thermal treatment module) →the vertical unit T31 (inspection module OUT-WIS). Thus, the developing treatment is performed on the wafer W, so that a resist pattern is formed on the wafer W and the inspection of the wafer W after the development is performed using the inspection module OUT-WIS. Note that, after the inspection, the wafer W is transferred by the wafer transfer mechanism M41 to the delivery module CPL14 and transferred out of the treatment block B2.

The wafer W is thereafter returned by the wafer transfer mechanism 12 or the wafer transfer mechanism 13 into the carrier C.

As explained above, the coating and developing apparatus 1 includes the treatment block B2 in which the treatment modules for treating the wafer W before exposure or after exposure are provided and the interface block B3 which couples the treatment block B2 and the exposure apparatus E in the width direction in this embodiment. Further, the treatment block B2 is multilayered in the up-down direction, in which the wafer transfer mechanisms M11 to M61, Q11 to Q61 are provided in the transfer regions M1 to M6, Q1 to Q6 extending in the width direction. Further, in the first to third layer blocks P1 to P3, in the treatment block B2, at heights accessible from the wafer transfer mechanism 41 in the interface block B3, (A) the delivery boxes 33, 34 are provided at the end on the interface block B3 side,
(B) the plurality of pre-exposure storing modules SBU1 are provided along the width direction at least one (region on the deep side in the depth direction in this embodiment) of the two regions between which the transfer regions Q1 to Q3 are interposed in the depth direction, and
(C) the treatment solution units CHE1 to 3 as the non-treatment units are provided in a portion (region on the near side in the depth direction in this embodiment) where the pre-exposure storing modules SBU1 are not provided in the two regions.

In other words, the coating and developing apparatus 1 is provided with a large number of portions where the wafers W which have been subjected to the treatments until before exposure are stored, such as the plurality of pre-exposure storing modules SBU1, the pre-exposure delivery box 33 and so on. Therefore, the coating and developing apparatus 1 can cope with the high throughput.

Further, in the coating and developing apparatus 1, the pre-exposure storing modules SBU1 and the pre-exposure delivery box 33 are provided in the first to third layer blocks P1 to P3 in the treatment block B2 in which the non-treatment units are provided. Therefore, the occupied floor area of the apparatus can be made smaller than the configuration in which the pre-exposure storing modules SBU1 and the pre-exposure delivery box 33 are provided in the interface block B3, unlike this embodiment.

Further, in the coating and developing apparatus 1, the pre-exposure delivery box 33 and the pre-exposure storing modules SBU1 are provided in the first to third layer blocks P1 to P3 at heights accessible from the wafer transfer mechanism 41 in the interface block B3. Accordingly, another wafer transfer mechanism and the like are unnecessary for the delivery of the wafer W between the pre-exposure delivery box 33 or the pre-exposure storing module SBU1 and the wafer transfer mechanism 41, thus preventing an increase in size of the apparatus. Further, the delivery of the wafer W can be performed in a short time.

Therefore, according to this embodiment, it is possible to provide a small-size coating and developing apparatus capable of coping with treatments at high throughput.

Note that when the treatment block is composed of a plurality of sub-blocks from the viewpoint of transport or the like, sub-blocks having almost the same size are used because of the design efficiency or the like in some cases. In this case, the space in the sub-block is sometimes not filled only with the treatment modules directly relating to the coating and developing treatments, such as the solution treatment module, the thermal treatment module and so on. In such a case, the layer blocks not filled with the directly relating treatment modules are made to be located at heights accessible from the wafer transfer mechanism 41 in the interface block B3. Further, the pre-exposure storing modules SBU1, the pre-exposure delivery box 33, the treatment solution units CHE1 to 3 as the non-treatment units are provided in these layer blocks, thereby enabling effective use of the not-filled layer blocks.

Further, the treatment solution units CHE1 to 3 are provided in the regions on the near side in the depth direction on which the operator easily performs the operations in the coating and developing apparatus 1 in this embodiment, and the regions on the near side are the chemical chambers which accommodate the treatment solution units CHE1 to 3 in this embodiment. Accordingly, the maintenance operation and so on can be easily performed for the chemical chambers.

In particular, since the first to third layer blocks P1 to P3 in which the treatment solution units CHE1 to 3 are provided are located at a lower part, the maintenance operation and so on can be more easily performed.

Note that since the treatment solution units CHE1 to 3 are provided not on the deep side which is the thermal treatment module side but on the near side which is the solution treatment module side, the treatment solutions in the treatment solution units CHE1 to 3 are never affected by heat. Further, since the treatment solution units CHE1 to 3 are provided on the solution treatment module side, there is little influence of a lifting height difference or a piping length between the treatment solution units CHE1 to 3 and the solution treatment modules.

Further, since the first to third layer blocks P1 to P3 are located at a lower part, namely, the layer blocks which are access destinations of the wafer transfer mechanism 41 in the interface block B3 are located at a lower part in this embodiment, the height of the wafer transfer mechanism 41 can be suppressed.

Note that there is a limit in height of the wafer transfer mechanism 41 which transfers the wafer W into/out of the exposure apparatus E in some cases. In this case, unless the layer blocks in which the pre-exposure delivery box 33 and the like are provided are located at a lower part accessible from the wafer transfer mechanism 41, another wafer transfer mechanism or the like is necessary. In contrast to this, the layer blocks are located at a lower part as explained above in this embodiment, so that another wafer transfer mechanism is unnecessary, resulting in prevention of an increase in size of the apparatus.

Furthermore, the pre-exposure delivery box 33 and the post-exposure delivery box 34 are provided in different layer blocks in this embodiment. Therefore, individual wafer transfer mechanisms Q11, Q31 can be used for the pre-exposure delivery box 33 and the post-exposure delivery box 34. More specifically, the wafer transfer mechanisms Q11, Q31 can be used respectively when the wafer W to be transferred out to the exposure apparatus E is moved to the interface block B3 and when the wafer W after exposure processing is received from the interface block B3. Accordingly, since the transfer of the wafer W to the pre-exposure delivery box 33 and the transfer of the wafer W out of the post-exposure delivery box 34 can be simultaneously performed, the wafer transfer can be efficiently performed, thereby achieving higher throughput.

Further, the pre-exposure delivery box 33 is provided to extend across a plurality of layers in this embodiment and therefore can accumulate many wafers W. Accordingly, if the treatments are performed at higher throughput, the pre-exposure delivery box 33 can cope with the treatments.

The pre-exposure storing module SBU1 is also provided to extend across a plurality of layers in this embodiment and therefore can accumulate many wafers W. Accordingly, if the treatments are performed at higher throughput, the pre-exposure storing module SBU1 can cope with the treatments.

Further, the first layer block P1 and the second layer block P2 in which the pre-exposure delivery box 33 and the pre-exposure storing modules SBU1 exist are layered in this embodiment, and the wafer transfer mechanism Q11 is shared between the layer blocks P1 and P2. The frequency of use of the wafer transfer mechanism Q11 is lower than that of the wafer transfer mechanisms in the layer blocks in which the solution treatment modules or the like are provided. Accordingly, the sharing the wafer transfer mechanism Q11 between the first and second layer blocks P1 and P2 can achieve effective use of the mechanism Q11.

Note that the wafer transfer mechanism may be provided in each of the first and second layer blocks P1 and P2. Further, the pre-exposure delivery box 33 and the pre-exposure storing modules SBU1 are shared between the first and second layer blocks P1 and P2 in this embodiment, but they may be provided in each of the blocks.

Further, in the left sub-block B21, the vertical units T31, T41, T51, T61 each having the inspection module OUT-WIS are provided on the side opposite to the right sub-block B22, namely, on the carrier block B1 side in the layer blocks L3 to L6 in which the developing modules are provided in this embodiment. Accordingly, the inspection module OUT-WIS is provided on the path for transferring the wafer W after the developing treatment to the carrier block B1 or the like for subsequent processes, thus making it possible to reduce the time period from the finish of the development to the transfer of the wafer W out to the carrier block B1 after undergoing the inspection in the inspection module OUT-WIS. Accordingly, the coating and developing treatments can be performed at higher throughput.

Further, in this embodiment, the inspection module IN-WIS is provided in the vicinity of the block closer to the height of the carrier C on the mounting plate 11, that is, the first layer block L1 or second layer block L2 into which the wafer W may be transferred first in the treatment block B2. This enables the wafer transfer mechanism 12 or the like to transfer the wafer W in the carrier C to the treatment block B2 via the inspection module IN-WIS through a path with less waste.

Note that the vertical units T11, T21 each having the inspection module WIS-B which inspects the wafer W after the formation of the anti-reflection film are provided on the carrier block B1 side in this embodiment, but may be provided on the right sub-block B22 side. This can reduce the time period from the finish of the formation of the anti-reflection film to the transfer of the wafer W out to the right sub-block B22 after undergoing the inspection in the inspection module WIS-B.

Further, the vertical units U44, U54, U64 each having the inspection module WES are provided on the interface block B3 side in this embodiment, but may be provided on the left sub-block B21 side.

The treatment block B2 is composed of two sub-blocks in the above example, but may be composed of three or more sub-blocks. Alternatively, the treatment block B2 may be composed of one block.

Further, the layer blocks in which the pre-exposure delivery box, the pre-exposure storing modules, the treatment solution units as the non-treatment units are provided include the lower-most layer block in the above example, but do not need to include the lower-most layer block.

Since the wafer transfer-in/out port on the exposure apparatus E is located at a lower part in the above example, the wafer transfer mechanism 41 in the interface block B3 is provided at a lower part, and the pre-exposure delivery box, the pre-exposure storing modules, and the treatment solution units as the non-treatment units are provided in the layer blocks at a lower part. Therefore, when the wafer transfer-in/out port on the exposure apparatus E is located at an upper part, the wafer transfer mechanism 41 may be provided at an upper part and the pre-exposure delivery box and so on may be provided in the layer blocks at an upper part.

Further, the pre-exposure storing modules SBU1 are provided only on the deep side of the deep side and the near side in the depth direction in the above example, but may be provided only on the near side or may be provide on both the near side and the deep side.

The post-exposure storing modules SBU3 are provided in the above example, but the post-exposure storing modules SBU3 may be omitted. In the case where the post-exposure storing modules SBU3 are provided, the post-exposure storing modules SBU3 may be provided only on the near side or provided on both the near side and the deep side, instead of being provided only on the deep side, as in the above example, of the deep side and the near side in the depth direction.

Further, the treatment solution units CHE1 to 3 are provided as the non-treatment units in the above example, but an inspection unit which performs an inspection based on the imaging result and an electrical component such as a power supply may be provided in place of or in addition to the treatment solution units CHE1 to 3.

In the above example, all of the layer blocks accessible from the wafer transfer mechanism 41 in the interface block B3 are layer blocks having the pre-exposure delivery box 33 and the pre-exposure storing modules SBU1. However, the accessible layer blocks may include the layer block in which the treatment modules such as the solution treatment modules and the like are provided.

Further, the module for storing the wafer W is not provided in the interface block B3, but may be provided.

The embodiment disclosed herein is only an example in all respects and should not be considered to be restrictive. The above embodiment may be abbreviated, replaced, or changed in various forms without departing from the scope and spirit of the attached claims.

Note that the following configurations also belong to the technical scope of this disclosure.

(1) A coating and developing apparatus configured to form a resist film on a substrate, transfer the substrate to an exposure apparatus, and then perform a developing treatment on the substrate exposed in the exposure apparatus, the coating and developing apparatus including:

a treatment block in which a treatment module configured to treat the substrate before the exposure or after the exposure is provided; and a relay block configured to couple the treatment block and the exposure apparatus in a width direction, wherein:

in the relay block, a transfer-in/out mechanism configured to transfer the substrate into/out of the exposure apparatus is provided; and in the treatment block being multilayered in an up-down direction, a transfer mechanism configured to transfer the substrate is provided in a transfer region extending in the width direction, and in a layer, in the treatment block, at a height position accessible from the transfer-in/out mechanism in the relay block, a deliverer on which the substrate is mounted when the substrate is delivered between both the blocks is provided at an end on the relay block side, a plurality of pre-exposure storages each configured to store the substrate before the exposure are provided along the width direction in at least one of two regions between which the transfer region is interposed in a depth direction perpendicular to the width direction, and a non-treatment unit which causes no change of state in the substrate is provided at a portion where the pre-exposure storages are not provided in the two regions.

According to the (1), it is possible to provide a coating and developing apparatus having capable of coping with treatments at high throughput and a small occupied area.

(2) The coating and developing apparatus according to the (1), wherein the non-treatment unit includes a treatment solution unit including at least one of a treatment solution bottle configured to store a treatment solution used in the treatment module and a pump configured to pressure-feed the treatment solution to the treatment module.

(3) The coating and developing apparatus according to the (2), further including:

an operation panel configured to operate the coating and developing apparatus, wherein the treatment solution unit is provided in a region on the operation panel side of the two regions.

(4) The coating and developing apparatus according to any one of the (1) to (3), wherein the non-treatment unit includes an inspection module configured to inspect the substrate.

(5) The coating and developing apparatus according to any one of the (1) to (4), wherein the layer at the accessible height position is a layer on a lower side in the treatment block.

(6) The coating and developing apparatus according to any one of the (1) to (5), wherein the treatment block includes a plurality of sub-blocks connected in the width direction.

(7) The coating and developing apparatus according to any one of the (1) to (6), wherein the deliverer includes a pre-exposure deliverer on which the substrate before the exposure is mounted and a post-exposure deliverer on which the substrate after the exposure is mounted.

(8) The coating and developing apparatus according to the (7), wherein the pre-exposure deliverer is provided in a layer different from a layer in which the post-exposure deliverer is provided.

(9) The coating and developing apparatus according to the (7) or (8), wherein:

the pre-exposure deliverer is provided in a plurality of layers; and the transfer mechanism is shared among the plurality of layers.

(10) The coating and developing apparatus according to any one of the (7) to (9), wherein the pre-exposure deliverer is configured to be able to regulate a temperature of the substrate mounted thereon.

(11) The coating and developing apparatus according to any one of the (7) to (10), wherein the pre-exposure storages are provided in a layer in which the pre-exposure deliverer is provided.

(12) The coating and developing apparatus according to any one of the (1) to (11), wherein:

the pre-exposure storages are provided in a plurality of layers; and the transfer mechanism is shared among the plurality of layers.

(13) The coating and developing apparatus according to any one of the (1) to (12), wherein the pre-exposure storage stores a plurality of the substrates in layers.

(14) The coating and developing apparatus according to any one of the (1) to (13), wherein the deliverer stores a plurality of the substrates in layers.

(15) The coating and developing apparatus according to any one of the (1) to (14), wherein in the layer at the accessible height position, a post-exposure storage configured to store the substrates after the exposure is provided in at least one of the two regions.

(16) The coating and developing apparatus according to any one of the (1) to (15), wherein:

in a layer, in the treatment block, at a height position inaccessible from the transfer-in/out mechanism in the relay block, the treatment module is provided; and the transfer mechanism is provided independently for each of the layer at the accessible height position and the layer at the inaccessible height position.

(17) The coating and developing apparatus according to any one of the (1) to (16), wherein in the relay block, the transfer-in/out mechanism is provided in a relay side transfer region extending in the depth direction.

(18) The coating and developing apparatus according to the (6), wherein:

a developing module configured to perform the developing treatment is provided in a second sub-block different from a first sub-block in which the non-treatment unit and the pre-exposure storages are provided; and in the second sub-block, an inspection module configured to inspect the substrate after the developing treatment is provided on a side opposite to the first sub-block in a layer in which the developing module is provided.

(19) The coating and developing apparatus according to the (18), further including a carrier block on which a carrier for collectively transferring a plurality of substrates is mounted, the carrier block being provided on a side opposite to the first sub-block in the second sub-block.

(20) A coating and developing method using the coating and developing apparatus according to any one of the (1) to (19), the transfer mechanism transferring the substrate treated in the treatment module to the pre-exposure storage in the treatment block;

thereafter the transfer mechanism transferring the substrate from the pre-exposure storage to the deliverer;

thereafter the transfer-in/out mechanism transferring the substrate out of the deliverer and transferring the substrate into the exposure apparatus;

after the exposure in the exposure apparatus, the transfer-in/out mechanism transferring the substrate out of the exposure apparatus and transferring the substrate to the deliverer; and thereafter the transfer mechanism transferring the substrate out of the deliverer.

According to this disclosure, it is possible to provide a small-size coating and developing apparatus capable of coping with treatments at high throughput.

What is claimed is:

1. A coating and developing apparatus configured to form a resist film on a substrate, transfer the substrate to an exposure apparatus, and then perform a developing treatment on the substrate exposed in the exposure apparatus, the coating and developing apparatus comprising:

a treatment block in which a treatment module configured to treat the substrate before the exposure or after the exposure is provided; and a relay block configured to couple the treatment block and the exposure apparatus in a width direction, wherein:

in the relay block, a transfer-in/out mechanism configured to transfer the substrate into/out of the exposure apparatus is provided; and in the treatment block being multilayered in an up-down direction, a plurality of transfer mechanisms each configured to transfer the substrate are respectively provided along the up-down direction in a transfer region of a plurality of transfer regions, each transfer region extending in the width direction, and in a layer, in the treatment block, at a height position accessible from the transfer-in/out mechanism in the relay block, a deliverer on which the substrate is mounted when the substrate is delivered between both the blocks is provided at an end on the relay block side, a plurality of pre-exposure storages each configured to store the substrate before the exposure are provided along the width direction in at least one of two regions between which the transfer region is interposed in a depth direction perpendicular to the width direction, and a non-treatment unit which causes no change of state in the substrate is provided at a portion where the pre-exposure storages are not provided in the two regions.

2. The coating and developing apparatus according to claim 1, wherein the non-treatment unit comprises a treatment solution unit comprising at least one of a treatment solution bottle configured to store a treatment solution used in the treatment module and a pump configured to pressure-feed the treatment solution to the treatment module.

3. The coating and developing apparatus according to claim 2, further comprising:

an operation panel configured to operate the coating and developing apparatus, wherein the treatment solution unit is provided in a region on the operation panel side of the two regions.

4. The coating and developing apparatus according to claim 1, wherein the non-treatment unit comprises an inspection module configured to inspect the substrate.

5. The coating and developing apparatus according to claim 1, wherein the layer at the accessible height position is a layer on a lower side in the treatment block.

6. The coating and developing apparatus according to claim 1, wherein the treatment block comprises a plurality of sub-blocks connected in the width direction.

7. The coating and developing apparatus according to claim 6, wherein:

a developing module configured to perform the developing treatment is provided in a second sub-block different from a first sub-block in which the non-treatment unit and the pre-exposure storages are provided; and in the second sub-block, an inspection module configured to inspect the substrate after the developing treatment is provided on a side opposite to the first sub-block in a layer in which the developing module is provided.

8. The coating and developing apparatus according to claim 7, further comprising a carrier block on which a carrier for collectively transferring a plurality of substrates is mounted, the carrier block being provided on a side opposite to the first sub-block in the second sub-block.

9. The coating and developing apparatus according to claim 1, wherein the deliverer comprises a pre-exposure deliverer on which the substrate before the exposure is mounted and a post-exposure deliverer on which the substrate after the exposure is mounted.

10. The coating and developing apparatus according to claim 9, wherein the pre-exposure deliverer is provided in a layer different from a layer in which the post-exposure deliverer is provided.

11. The coating and developing apparatus according to claim 9, wherein:

the pre-exposure deliverer is provided in a plurality of layers; and at least one transfer mechanism of the plurality of transfer mechanisms is shared among the plurality of layers.

12. The coating and developing apparatus according to claim 9, wherein the pre-exposure deliverer is configured to be able to regulate a temperature of the substrate mounted thereon.

13. The coating and developing apparatus according to claim 1, wherein the two regions are overlapped, in a top plan view, with a region provided with the treatment module in a different layer of the treatment block, wherein the different layer is different in height from the layer at the height position accessible from the transfer-in/out mechanism in the relay block.

14. The coating and developing apparatus according to claim 13, wherein a plurality of the treatment modules are provided, in the different layer, along the width direction, and each of the pre-exposure storages stores a plurality of the substrates in layers.

15. The coating and developing apparatus according to claim 1, wherein:

the pre-exposure storages are provided in a plurality of layers; and at least one transfer mechanism of the plurality of transfer mechanisms is shared among the plurality of layers.

16. The coating and developing apparatus according to claim 1, wherein the deliverer stores a plurality of the substrates in layers.

17. The coating and developing apparatus according to claim 1, wherein in the layer at the accessible height position, a post-exposure storage configured to store the substrates after the exposure is provided in at least one of the two regions.

18. The coating and developing apparatus according to claim 1, wherein:

in a layer, in the treatment block, at a height position inaccessible from the transfer-in/out mechanism in the relay block, the treatment module is provided; and at least one of the plurality of transfer mechanisms is provided independently for each of the layer at the accessible height position and the layer at the inaccessible height position.

19. The coating and developing apparatus according to claim 1, wherein
in the relay block, the transfer-in/out mechanism is provided in a relay side transfer region extending in the depth direction.

20. A coating and developing method using a coating and developing apparatus,
the coating and developing apparatus configured to form a resist film on a substrate, transfer the substrate to an exposure apparatus, and then perform a developing treatment on the substrate exposed in the exposure apparatus, the coating and developing apparatus comprising:
a treatment block in which a treatment module configured to treat the substrate before the exposure or after the exposure is provided; and
a relay block configured to couple the treatment block and the exposure apparatus in a width direction, wherein:
in the relay block, a transfer-in/out mechanism configured to transfer the substrate into/out of the exposure apparatus is provided; and
in the treatment block being multilayered in an up-down direction,
a plurality of transfer mechanisms each configured to transfer the substrate are respectively provided along the up-down direction in a transfer region of a plurality of transfer regions, each transfer region extending in the width direction, and
in a layer, in the treatment block, at a height position accessible from the transfer-in/out mechanism in the relay block,
a deliverer on which the substrate is mounted when the substrate is delivered between both the blocks is provided at an end on the relay block side,
a plurality of pre-exposure storages each configured to store the substrate before the exposure are provided along the width direction in at least one of two regions between which the transfer region is interposed in a depth direction perpendicular to the width direction, and
a non-treatment unit which causes no change of state in the substrate is provided at a portion where the pre-exposure storages are not provided in the two regions,
the coating and developing method comprising:
the transfer mechanism transferring the substrate treated in the treatment module to the pre-exposure storage in the treatment block;
thereafter the transfer mechanism transferring the substrate from the pre-exposure storage to the deliverer;
thereafter the transfer-in/out mechanism transferring the substrate out of the deliverer and transferring the substrate into the exposure apparatus;
after the exposure in the exposure apparatus, the transfer-in/out mechanism transferring the substrate out of the exposure apparatus and transferring the substrate to the deliverer; and
thereafter the transfer mechanism transferring the substrate out of the deliverer.

* * * * *